United States Patent [19]

Hashimoto et al.

[11] Patent Number: 4,585,954

[45] Date of Patent: Apr. 29, 1986

[54] SUBSTRATE BIAS GENERATOR FOR DYNAMIC RAM HAVING VARIABLE PUMP CURRENT LEVEL

[75] Inventors: Masashi Hashimoto, Miho, Japan; Chitranjan Reddy, Sugarland, Tex.

[73] Assignee: Texas Instruments Incorporated, Dallas, Tex.

[21] Appl. No.: 512,078

[22] Filed: Jul. 8, 1983

[51] Int. Cl.[4] .............................................. H03K 3/354

[52] U.S. Cl. .................................. 307/296 R; 307/297

[58] Field of Search .................... 307/296 R, 297, 304, 307/200 B

[56] References Cited

U.S. PATENT DOCUMENTS

| | | | |
|---|---|---|---|
| 4,322,675 | 3/1982 | Lee et al. | 307/297 X |
| 4,388,537 | 6/1983 | Kanuma | 307/297 |
| 4,409,496 | 10/1983 | Baba | 307/296 R |
| 4,455,628 | 6/1984 | Ozaki et al. | 307/296 R X |
| 4,460,835 | 7/1984 | Masuoka | 307/296 R |
| 4,471,290 | 9/1984 | Yamaguchi | 307/297 X |

*Primary Examiner*—Stanley D. Miller
*Assistant Examiner*—D. R. Hudspeth
*Attorney, Agent, or Firm*—John G. Graham

[57] ABSTRACT

A dynamic MOS read/write memory has a substrate bias generator circuit which includes, in this example, four separate pump circuits. A first of these operates only during power-up to quickly produce the desired back bias; this pump circuit uses a high frequency oscillator and a low impedence drive, and cuts off to save power as soon as the necessary bias is reached. A second generates a smaller sustaining current, using a lower frequency oscillator and higher impedance drive; this functions to compensate for leakage during idle periods. The third and fourth pump circuits are driven by $\overline{RAS}$ and $\overline{CAS}$, so these occur only when needed, and at a rate dependent upon the actual operating condition of the memory.

11 Claims, 4 Drawing Figures

SUBSTRATE BIAS GENERATOR FOR DYNAMIC RAM HAVING VARIABLE PUMP CURRENT LEVEL

BACKGROUND OF THE INVENTION

This invention relates to semiconductor devices, and more particularly to substrate bias circuits of the type used in semiconductor dynamic memory devices or the like.

Semiconductor memory devices of the MOS dynamic read/write type, as well as other such devices, use substrate pump circuits to generate a negative voltage for substrate bias. These circuits are usually designed as a compromise of several conflicting requirements. The circuits consist of an oscillator driving switches to charge and discharge a capacitor through a diode-type element into the substrate; the frequency of the oscillator and the power level of the capacitor discharge are chosen to maintain the back bias at the proper level in average operating conditions without dissipating an excessive amount of power. But when the power level is chosen to be low the time needed to build up the full bias level after power-on is unduly long.

Leakage of the substrate bias is for the most part caused by impact ionization current. This current peaks when a transistor is pinched off, and is negligible at other times. Transistors are seldom in the pinch off state in an MOS dynamic memory except when output logic states switch, which occurs during an active cycle when $\overline{RAS}$ and/or $\overline{CAS}$ are cycled. Thus, the substrate pump is designed for peak load to supply current to compensate for leakage which occurs primarily during active memory cycles, but this results in unnecessary dissipation of power during standby.

It is the principal object of this invention to provide improved substrate pump circuits for semiconductor integrated circuits such as MOS dynamic memory devices. Another object is to provide an improved substrate pump which dissipates a minimum of power, yet builds up the substrate bias rapidly at power-on, and compensates for varying types of operating conditions.

SUMMARY OF THE INVENTION

In accordance with one embodiment of the invention, a dynamic MOS read/write memory has a substrate bias generator circuit which includes, in this example, four separate pump circuits. A first of these operates only during power-up to quickly produce the desired back bias; this pump circuit uses a high frequency oscillator and a low impedence drive, and cuts off to save power as soon as the necessary bias is reached. A second generates a smaller sustaining current, using a lower frequency oscillator and higher impedance drive; this functions to compensate for leakage during idle periods. The third and fourth pump circuits are driven by $\overline{RAS}$ and $\overline{CAS}$, so these occur only when needed, and at a rate dependent upon the acutal operating condition of the memory.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
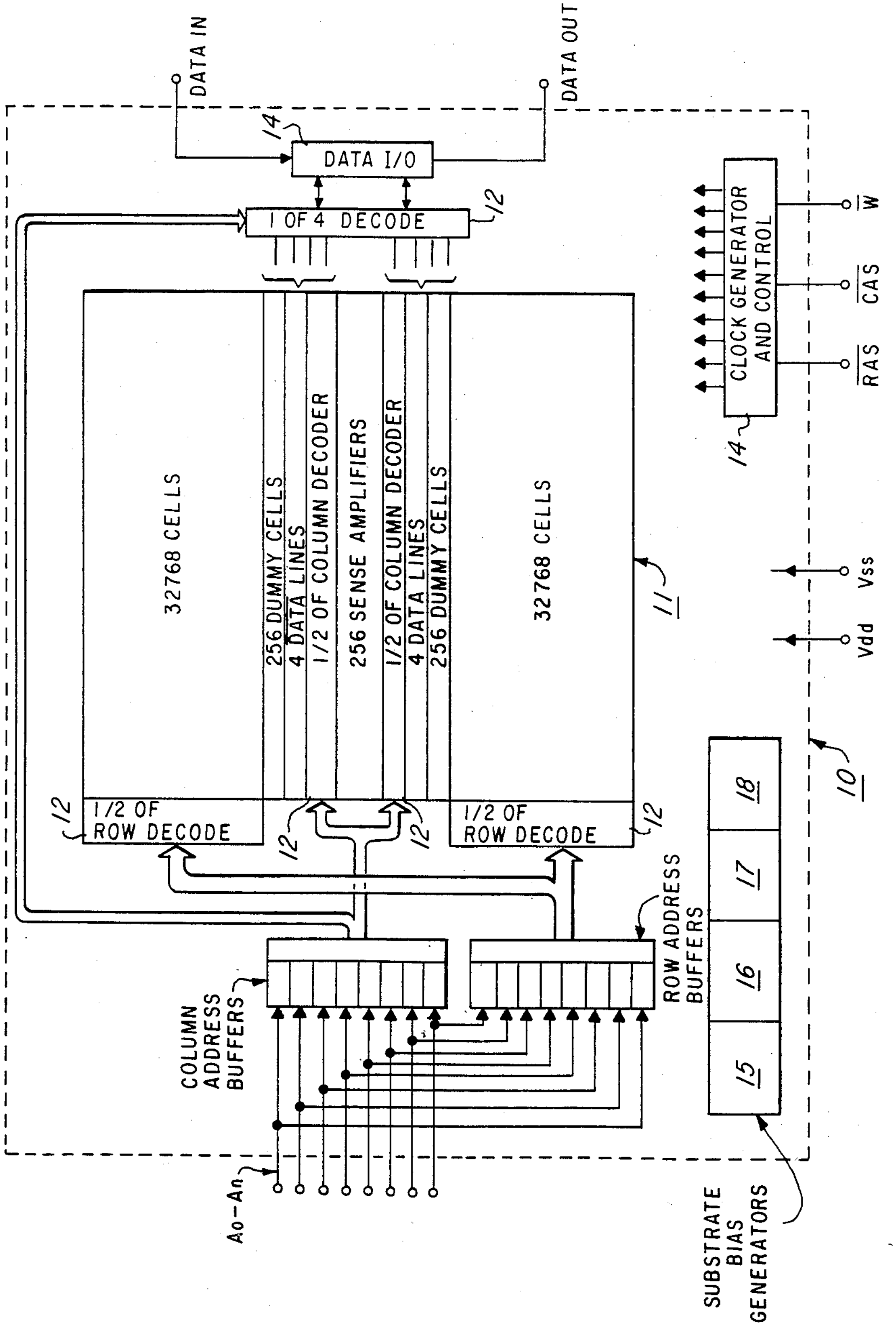
FIG. 1 is a block diagram of a memory device which may employ the substrate pump circuits of the invention.

Referring to FIG. 1, the substrate pump circuitry of the invention is used for a silicon substrate 10 having a dynamic RAM array 11 formed in a face. The dynamic RAM circuitry may be of the type shown in U.S. Pat. No. 4,239,993, for example, and includes input buffers connected to address inputs Ao-An, row and column decoders 12, data input/output circuits 13, and clock generator and control circuitry 14. The operation is controlled by $\overline{RAS}$, $\overline{CAS}$ and $\overline{W}$ on input pins. Power is supplied by Vdd and Vss terminals.

According to the invention, substrate bias is supplied by four pump circuits 15,16,17 and 18. The circuit 15 operates only during power-on and supplies a high current to build up the substrate bias −Vbb rather rapidly, then this circuit cuts off, and a standard pump circuit 16 supplies a low sustaining current for inactive periods. During active cycles, the pump circuits 17 and 18 operate when $\overline{RAS}$ and $\overline{CAS}$ are cycled.

Figure 2:
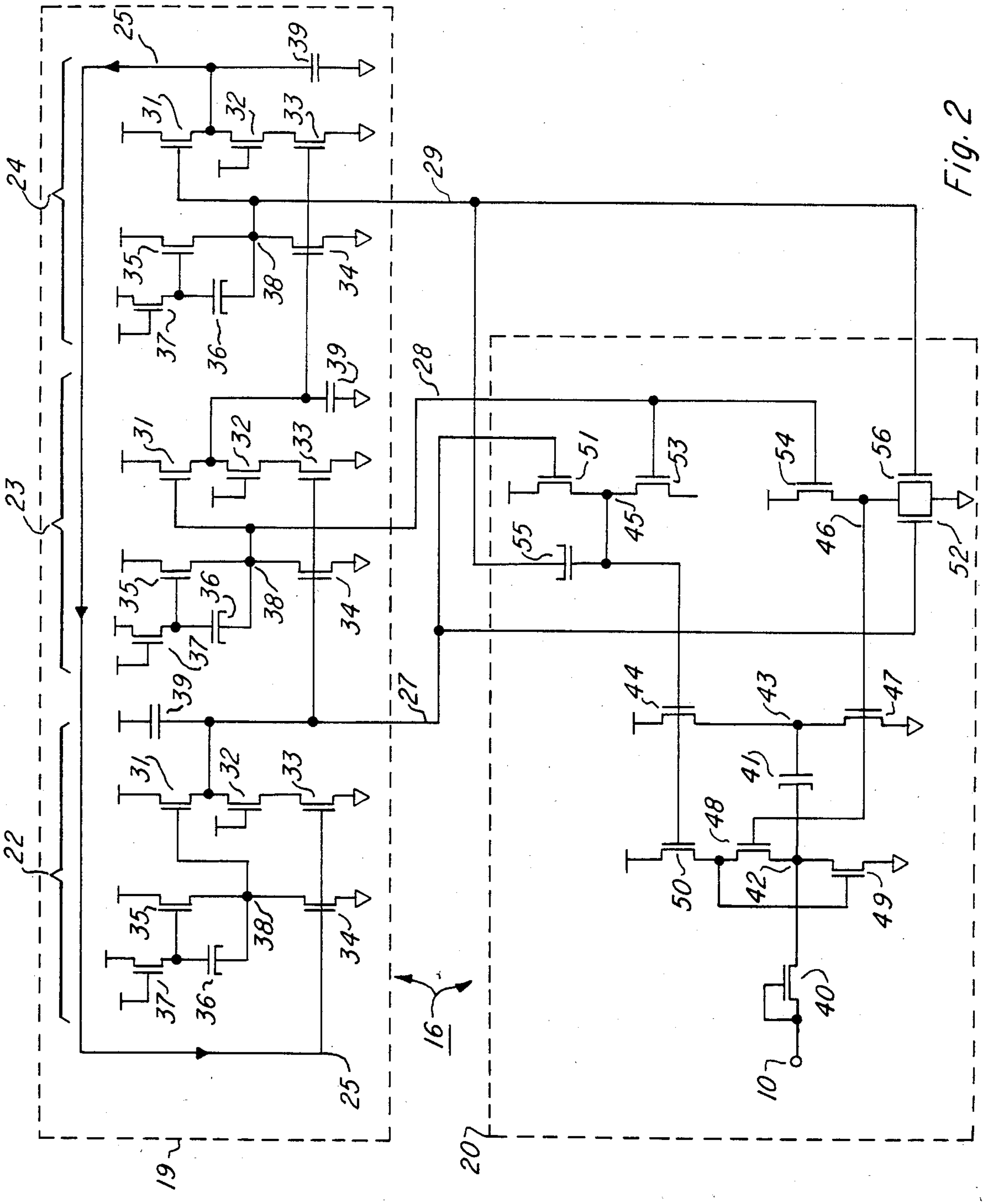
FIG. 2 is an electrical schematic diagram of one of the substrate pump circuits in FIG. 1.

In FIG. 2 the standard pump circuit 16 is shown in detail. This circuit employs a ring oscillator 19 operating at about 3 MHz, and a pump circuit 20 which produces about 0.5 ma pump current to the substrate 10. The oscillator has three stages 22, 23 and 24, and a feedback path 25 from the last to the first stage. A three-phase output 27, 28 and 29 is coupled from the oscillator 19 to the pump 20. Each of the stages 22, 23 and 24 has at its output three series transistors 31, 32 and 33, with the transistor 33 being an input driver pulling the output low, and with the transistor 31 pulling the output high as it receives the inverted input. Each stage has an inverter including a driver transistor 34 with a load 35 which is booted above Vdd by capacitor 36 and transistor 37 so that node 38 and the gate of transistor 31 will go to a high level. The frequency of the ring oscillator is determined by the capacitors 39 and the impedence of the transistors which charge and discharge these capacitors.

The pump circuit 20 of FIG. 2 uses a transistor 40 connected as a diode along with a capacitor 41 connected between nodes 42 and 43 to pump current from the substrate 10. Node 43 is driven high by a transistor 44 when 45 is high and node 46 is low. This condition turns off transistors 47 and 48, and places a Vdd voltage on the gate of transistor 49 through transistor 50, thus permitting transistor 49 to fully ground the node 42. Usually in this type of circuit the gate of transistor 49 is connected to node 42, preventing the node 42 from dropping all the way to Vss. When the node 46 goes high and node 45 goes low, the node 43 is grounded through transistor 47, and node 42 is decoupled from ground via transistor 49 which acts as a diode. In this condition the discharge of capacitor 41 pulls the substrate 10 negative through transistor 40. The nodes 45 and 46 are cycled high and low by the oscillator 19. When output 27 goes high, node 45 is pulled high by transistor 51 and node 46 pulled low by transistor 52.

When output 28 goes high the node 45 is pulled low by transistor 53 and node 46 pulled high by transistor 54. The output 29 pumps the node 45 to above Vdd through capacitor 55 in its high period so that transistors 44 and 50 will deliver a full Vdd to node 43 and the gate of transistor 49. Also, by transistor 56 the node 46 is pulled low. The outputs 27, 28 and 29 resemble a three-phase overlapping clock waveform. The size of the capacitor 41 and the transistors in series with it, as well as the frequency of the oscillator 19, determine the drive current of this pump circuit 16, selected to be about 0.5 ma.

For the power-on transient, the pump circuit 15 operates to quickly pump the substrate to a −Vbb level of −2Vt, using a high pump current of about five ma. Then, the pump circuit 15 cuts off and stays off. The circuit of the pump 15 is shown in detail in FIG. 3. This circuit is the same as FIG. 2 except that the oscillator is constructed to oscillate at a higher frequency, e.g. 15 MHz, and to be cut off to a zero power dissipation condition after its function is completed. The pump circuit 20 is identical to that in FIG. 2 except the capacitor 41 is larger and output transistors larger so that a higher current is supplied to the substrate.

Figure 3:
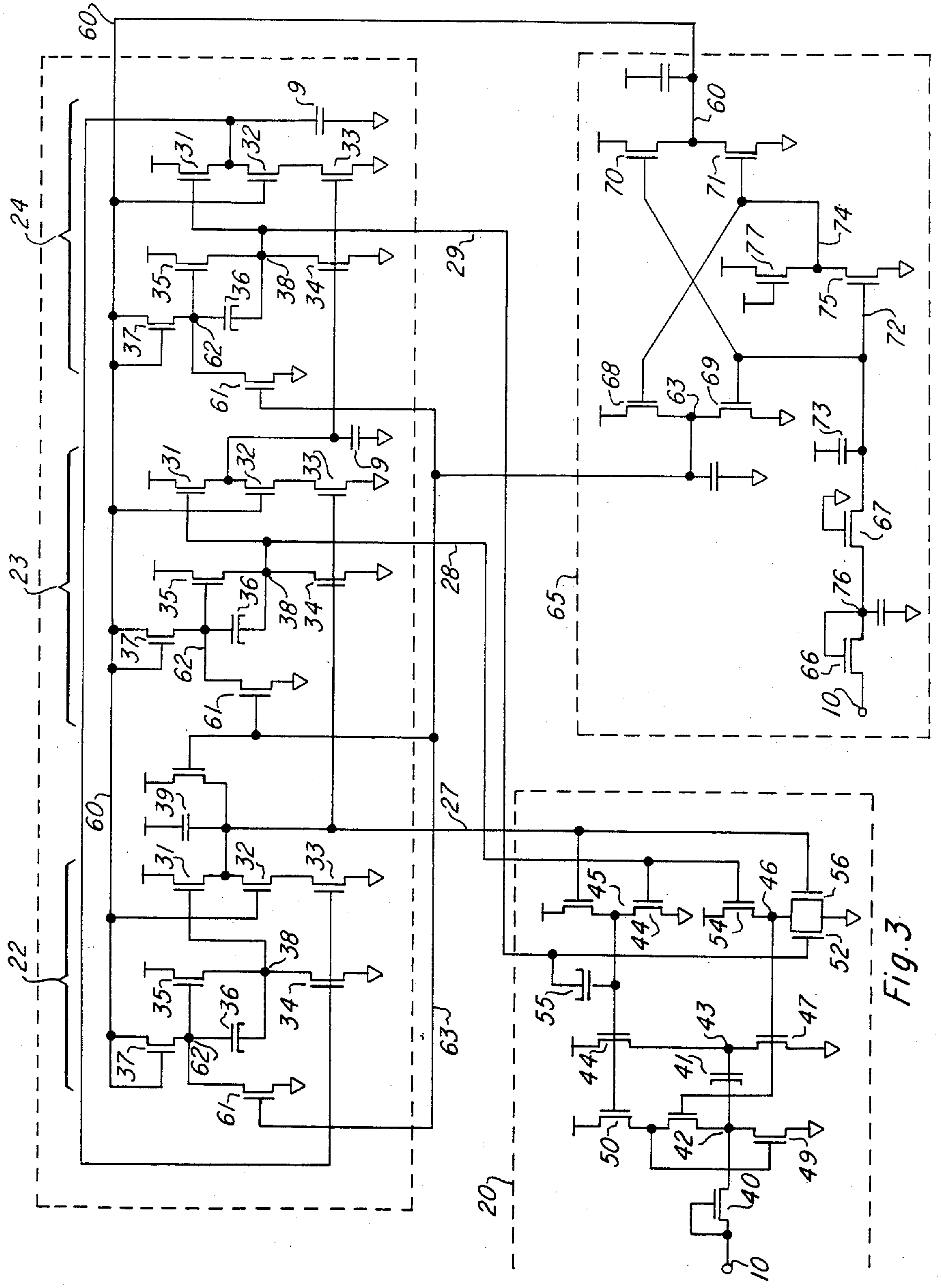
FIG. 3 is an electrical schematic diagram of another of the pump circuits of FIG. 1.

In FIG. 3, the transistors 37 are connected to a supply line 60, and the series transistors 32 are also connected to this supply line 60, so that the oscillator can be turned off by reducing the voltage on line 60 to zero. Also, transistors 61 are added to short nodes 62 to ground when a node 63 goes high; this prevents conduction due to residual voltage on the capacitors. When supply line 60 is low and node 63 is high, there is no d.c. path from Vdd to ground in any of the circuitry of the oscillator, and all of the outputs 27, 28 and 29 are low so the pump circuit 20 is totally cut off and dissipates no power.

A detector circuit 65 functions to sense when the substrate 10 is at a substrate voltage −Vbb of the desired level of −2Vt, and to turn off the oscillator by driving node 60 low and node 63 high. The node 10 is at zero potential at the time of power-on. The series transistors 66 and 67 in this circuit are turned off at the beginning. The circuit made up of cross-coupled transistors 68, 69 and 70, 71 will be initially in a state such that node 60 is at Vdd and node 63 is at ground; node 60 is the supply for the oscillator stages 22, 23, 24 and node 63 is the voltage that shorts the capacitor in the oscillator. Node 72 is booted to Vdd by capacitor 73 when the supply is turned on, thus turning on transistors 69 and 70, pulling node 60 high and node 63 low. Node 74 is held low by transistor 75. The node 72 stays at Vdd level until the node 76 reaches −Vt. Since the node 76 voltage is the substrate Vbb+Vt, the node 72 starts to discharge when Vbb reaches −2Vt. When node 72 goes below Vt, the transistors 69, 70 and 75 turn off and node 74 starts to be pulled high by transistor 77. The transistors 68 and 71 turn on when node 74 reaches Vt, so node 60 goes low and node 63 goes high, turning off the oscillator; this state remains until the power is turned off. Therefore, from power-on until −Vbb is pumped to −2Vt, this back-bias generator functions in normal manner with the oscillator running. But after the substrate bias −Vbb reached −2Vt, this ring oscillator is disabled by turning off its power supply 60 and it will not dissipate power at all.

Figure 4:
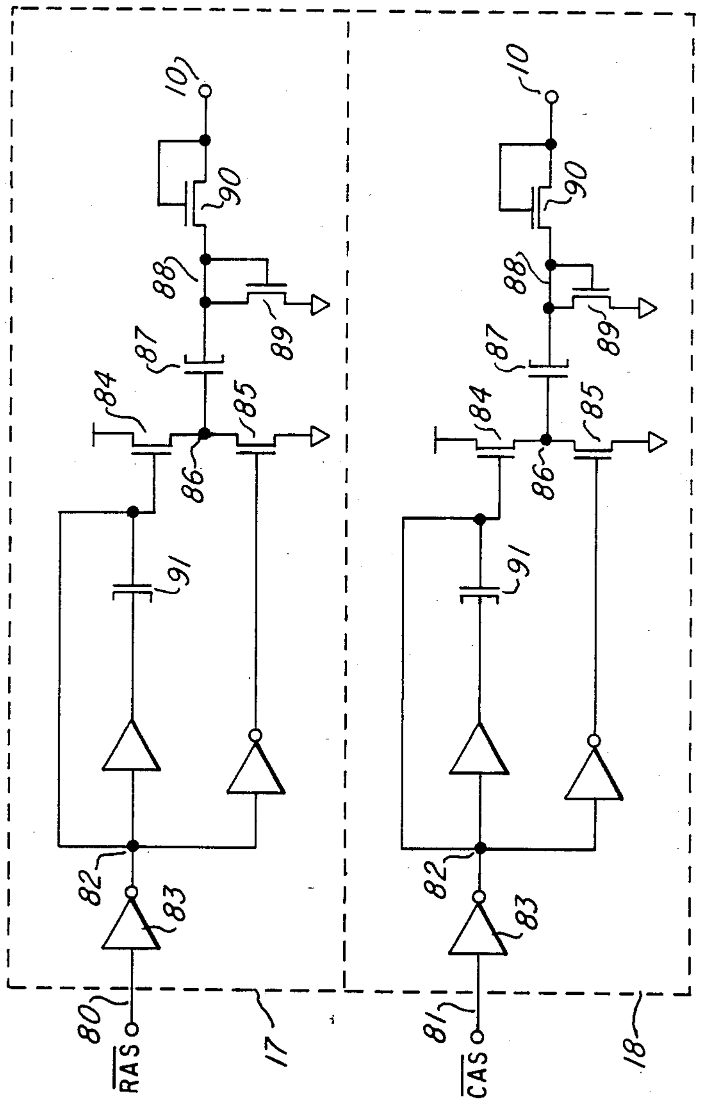
FIG. 4 is an electrical schematic diagram of still another of the pump circuits of FIG. 1.

Leakage of the substrate bias will occur principally during active memory cycles, and so pump circuits 17 and 18 as shown in FIG. 4 are added to pump the substrate when $\overline{RAS}$ and $\overline{CAS}$ occur on chip inputs 80 and 81. These iputs are high in the inactive period, and hold the nodes 82 low due to inverters 83; this holds transistors 84 off and transistors 85 on, discharging nodes 86 and capacitors 87. Node 88 on the other side of the capacitor will support a negative potential, but conducts to ground through transistor 89 when this node 88 attempts to go positive. Transistor 90 acts as a diode conducting when the substrate 10 is more positive than the node 88. When $\overline{RAS}$ falls, starting a read or write access (or refresh), the transistors 84, 85 switch and node 86 is charged to Vdd. An active cycle creates a number of internal clocks and many transistors in the chip switch state, so substrate bias leakage occurs. To compensate for this, when $\overline{RAS}$ (or $\overline{CAS}$) goes high in the circuit of FIG. 4 the node 86 goes low as transistor 85 turns on and the gate of transistor 84 drops. The gate of transistor 84 was booted above Vdd by capacitor 91, so a full supply voltage was stored across the capacitor 87. When node 86 goes low, this pulls the node 88 toward −Vdd, thus pumping the substrate 10 negative. Similarly, when $\overline{CAS}$ rises another negative pulse is coupled to the substrate 10 by the circuitry 18 of FIG. 4. During a lengthy period of $\overline{RAS}$-only refresh, $\overline{CAS}$ does not drop, and pumping will be at the refresh rate, for example (2 ms)/256 or one every 7.8 microsec. During a period of rapid read or write access, the pump rate by circuits 17 and 18 may be as high as the memory cycle time; for example, both $\overline{RAS}$ and $\overline{CAS}$ may occur every 300 nsec. During a period of page mode operation, $\overline{CAS}$ may occur every 50 nsec., in short bursts. Thus the pump rate is automatically adjusted to each unique operating condition of the memory.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A substrate bias pumping circuit for a dynamic MOS read/write memory or the like constructed on a semiconductor substrate, comprising:

(a) a first pump circuit having a first oscillator and a first output to the substrate, the first oscillator operating at a first frequency, (b) a second pump circuit having a second oscillator and a second output to the substrate, the second oscillator operating at a second frequency substantially lower than said first frequency, (c) a third pump circuit having a third output to the substrate and operating in response to a variable frequency clock input to the memory.

2. A circuit according to claim 1 wherein said first pump circuit includes means for detecting the substrate bias and turning off said first oscillator and first output when such bias reaches a selected level.

3. A circuit according to claim 2 wherein said first output is at a much higher current level than said second output.

4. A circuit according to claim 3 wherein said first pump circuit includes switching means to turn off all power dissipation when said first oscillator and first output are turned off.

5. A circuit according to claim 4 wherein said first pump circuit operates only at the time of initial application of power to the circuit.

6. A circuit according to claim 1 wherein said variable clock is row address strobe ($\overline{RAS}$).

7. A substrate bias generator for a semiconductor device comprising:

oscillator means having outputs coupled to first pump circuit means, means responsive to the substrate bias to control said oscillator means when the substrate bias exceeds a selected level, to reduce the output of said pump circuit means to a lower standby level, a second pump circuit and means to activate said second pump circuit when an external clock is applied to said device.

8. A substrate bias generator for a semiconductor device, the device comprising:

an oscillator having outputs coupled to a first pump circuit, means responsive to the substrate bias to turn off said oscillator when the substrate bias exceeds a selected level, a second pump circuit and means to activate said second pump circuit when an external clock is applied to said device, wherein said oscillator has a plurality of driver stages to drive said first pump circuit, and each driver stage has a series transistor coupled to enable said driver stage, and said means responsive to the substrate bias turns off said series transistor when the substrate bias exceeds said selected level.

9. A device according to claim 7 wherein a voltage supply to said oscillator means is turned on or turned off by said means responsive to the substrate bias.

10. A device according to claim 7 wherein said second pump circuit is activated by a row address strobe ($\overline{RAS}$) clock.

11. A device according to claim 10 including a third pump circuit activated by a columm address strobe ($\overline{CAS}$) clock applied to said device.

* * * * *